United States Patent
Ro et al.

(10) Patent No.: US 9,508,274 B2
(45) Date of Patent: Nov. 29, 2016

(54) THIN FILM TRANSISTOR SUBSTRATE, METHOD OF INSPECTING THE SAME, AND DISPLAY DEVICE INCLUDING THE SAME

(71) Applicant: Samsung Display Co., Ltd., Yongin-city (KR)

(72) Inventors: Sungin Ro, Hwaseong-si (KR); Hyangyul Kim, Hwaseong-si (KR); Seunghyun Park, Seoul (KR); Jaehak Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 361 days.

(21) Appl. No.: 13/895,794

(22) Filed: May 16, 2013

(65) Prior Publication Data

US 2014/0203835 A1 Jul. 24, 2014

(30) Foreign Application Priority Data

Jan. 21, 2013 (KR) .................. 10-2013-0006611

(51) Int. Cl.
*G01R 31/26* (2014.01)
*G09G 3/00* (2006.01)
*H01L 27/12* (2006.01)

(52) U.S. Cl.
CPC ........... *G09G 3/006* (2013.01); *H01L 27/1251* (2013.01)

(58) Field of Classification Search
CPC ............. G09G 3/006; H01L 27/1251; G01R 31/3025; G01R 31/2884; G01N 27/4141
USPC ............................. 324/500, 760.01–762.03, 324/762.08–763.01, 76.11; 257/48, 207; 438/4, 15, 25, 30, 48
See application file for complete search history.

(56) References Cited

U.S. PATENT DOCUMENTS

| | | | |
|---|---|---|---|
| 6,025,891 A | 2/2000 | Kim | |
| 6,028,442 A * | 2/2000 | Lee et al. | 324/760.02 |
| 7,545,162 B2 * | 6/2009 | Chung | 324/760.01 |
| 2006/0285054 A1 | 12/2006 | Teramoto | |
| 2007/0018680 A1 * | 1/2007 | Jeon et al. | 324/770 |
| 2009/0294771 A1 | 12/2009 | Kim et al. | |

(Continued)

FOREIGN PATENT DOCUMENTS

| | | |
|---|---|---|
| JP | 2003-241219 | 8/2003 |
| JP | 2006-350155 | 12/2006 |
| KR | 10-0244184 | 11/1999 |
| KR | 10-2005-0108882 | 11/2005 |

(Continued)

*Primary Examiner* — Vincent Q Nguyen
*Assistant Examiner* — Trung Nguyen
(74) *Attorney, Agent, or Firm* — H.C. Park & Associates, PLC

(57) ABSTRACT

A thin film transistor substrate, includes: pixels disposed in a display area of the thin film transistor substrate and connected to gate lines and data lines; gate pad parts connected to first ends of the gate lines; first test transistors each being connected to a second end of a corresponding gate line of the gate lines; data pad parts connected to first ends of the data lines; and second test transistors each being connected to a second end of a corresponding data line of the data lines. The gate pad parts, the data pad parts, the first test transistors, and the second test transistors are disposed in a non-display area of the thin film transistor substrate. The first test transistors are configured to be switched to receive a first inspection signal and the second test transistors are configured to be switched to receive a second inspection signal.

25 Claims, 8 Drawing Sheets

(56) References Cited

U.S. PATENT DOCUMENTS

| | | |
|---|---|---|
| 2010/0213969 A1 | 8/2010 | Kim |
| 2012/0026076 A1 | 2/2012 | Huang et al. |
| 2012/0249606 A1* | 10/2012 | Teranishi ............. G09G 3/2074 345/690 |
| 2013/0143463 A1* | 6/2013 | Park et al. ....................... 445/24 |
| 2013/0155357 A1* | 6/2013 | Ota ............................... 349/110 |

FOREIGN PATENT DOCUMENTS

| | | |
|---|---|---|
| KR | 10-0561150 | 3/2006 |
| KR | 10-2006-0093768 | 8/2006 |
| KR | 10-2007-0033699 | 3/2007 |
| KR | 10-2007-0063310 | 6/2007 |
| KR | 10-0806885 | 2/2008 |

\* cited by examiner

THIN FILM TRANSISTOR SUBSTRATE, METHOD OF INSPECTING THE SAME, AND DISPLAY DEVICE INCLUDING THE SAME

CROSS-REFERENCE TO RELATED APPLICATION

This application claims priority from and the benefit of Korean Patent Application No. 10-2013-0006611, filed on Jan. 21, 2013, which is incorporated by reference for all purposes as if set forth herein.

BACKGROUND

1. Field

Exemplary embodiments relate to a thin film transistor substrate, a method of inspecting the thin film transistor substrate, and a display device including the thin film transistor substrate.

2. Discussion

A liquid crystal display typically includes a display panel displaying an image and a backlight unit providing light to the display panel. The display panel usually includes a thin film transistor substrate on which thin film transistors are formed, a color filter substrate, on which color filters are formed, facing the thin film transistor substrate, and a liquid crystal layer disposed between the thin film transistor substrate and the color filter substrate.

Typically, a thin film transistor substrate includes a plurality of pixels each being driven by a corresponding thin film transistor of the thin film transistor substrate. Pixel voltages are applied to the pixels by the thin film transistors and an arrangement of liquid crystal molecules of the liquid crystal layer is changed based on the pixel voltages. In this manner, a transmittance of light passing through the liquid crystal layer may be controlled based on the arrangement of the liquid crystal molecules, which facilitates displaying a desired image.

Conventionally, when a display panel is being manufactured, various inspections are utilized to detect defects in products. These inspections may be classified into different types, such as visual inspection (VI), gross test (G/T) inspection, final test inspection, array test inspection, etc.

Among the various types of inspections, visual inspection typically entails applying an inspection signal to the thin film transistor substrate using a shorting bar. After the inspection signal is applied to the thin film transistor substrate, short or open states between, for instance, gate lines, data lines, and pixels in an active (e.g., display) area in which the pixels are formed may be detected by the naked eye. For example, visual inspection may be conducted by observing a resistance image after applying a predetermined voltage to the gate lines connected to the pixels of the thin film transistor substrate.

Since manufacturing yield typically drives cost, there is a need for an approach that provides efficient, cost-effective techniques to inspect thin film transistor substrates at various manufacturing stages, as well as in various areas of the thin film transistor substrate.

The above information disclosed in this Background section is only for enhancement of understanding of the background of the invention and, therefore, it may contain information that does not form any part of the prior art nor what the prior art may suggest to a person of ordinary skill in the art.

SUMMARY

Exemplary embodiments provide a thin film transistor substrate including test parts to facilitate inspection using a non-display area.

Exemplary embodiments provide a display apparatus including a thin film transistor substrate including test parts to facilitate inspection using a non-display area.

Exemplary embodiments provide a method to detect defects in a display area via visual inspection and to detect defects in a non-display area via contact or non-contact inspection techniques.

Additional aspects will be set forth in the detailed description which follows and, in part, will be apparent from the disclosure, or may be learned by practice of the invention.

According to exemplary embodiments, a thin film transistor substrate, includes: a plurality of pixels disposed in a display area of the thin film transistor substrate, the plurality of pixels being connected to a plurality of gate lines and a plurality of data lines; a plurality of gate pad parts connected to first ends of the plurality of gate lines, a plurality of first test transistors, each of the plurality of test transistors being connected to a second end of a corresponding gate line of the plurality of gate lines; a plurality of data pad parts connected to first ends of the plurality of data lines; and a plurality of second test transistors, each of the plurality of second test transistors being connected to a second end of a corresponding data line of the plurality of data lines. The plurality of gate pad parts, the plurality of data pad parts, the plurality of first test transistors, and the plurality of second test transistors are disposed in a non-display area of the thin film transistor substrate. The plurality of first test transistors is configured to be switched to receive a first inspection signal and the plurality of second test transistors is configured to be switched to receive a second inspection signal.

According to exemplary embodiments, a method, includes: applying, via a test part disposed in a non-display area of a display substrate, an inspection signal to a plurality of signal lines; determining, in association with a first inspection technique, whether any of the plurality of signal lines includes a defect in a display area of the display substrate based on a resistance image formed in the display area in association with the applying of the inspection signal; and determining, in association with a second inspection technique, whether any of the plurality of signal lines comprises a defect in the non-display area.

According to exemplary embodiments, a display device, includes: a thin film transistor substrate, including: a plurality of pixels disposed in a display area of the display device, the plurality of pixels being connected to a plurality of gate lines and a plurality of data lines, and a plurality of test parts disposed in a non-display area of the display device; a gate driver to apply one or more gate signals to the plurality of pixels, and a data driver to apply one or more data voltages to the plurality of pixels. The display device includes a plurality of gate pad parts connected to first ends of the plurality of gate lines and the gate driver in the non-display area. A first one of the plurality of test parts includes a plurality of first test transistors, each of the plurality of first test transistors being connected to a second end of a corresponding gate line of the plurality of gate lines. The display device includes a plurality of data pad parts connected to first ends of the plurality of data lines and the data driver in the non-display area. A second one of the plurality of test parts includes a plurality of second test transistors, each second test transistor being connected to a second end of a corresponding data line of the plurality of data lines. The plurality of first test transistors are configured to be switched to receive a first inspection signal and the plurality of second test transistors are configured to be switched to receive a second inspection signal.

According to exemplary embodiments, test parts to facilitate inspection may be disposed in a non-display area without spatial limitation. It is further noted that, according to exemplary embodiments, defects in a display area may be detected via visual inspection and defects in a non-display area may be detected via non-contact or contact inspection techniques.

The foregoing general description and the following detailed description are exemplary and explanatory and are intended to provide further explanation of the invention as claimed

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
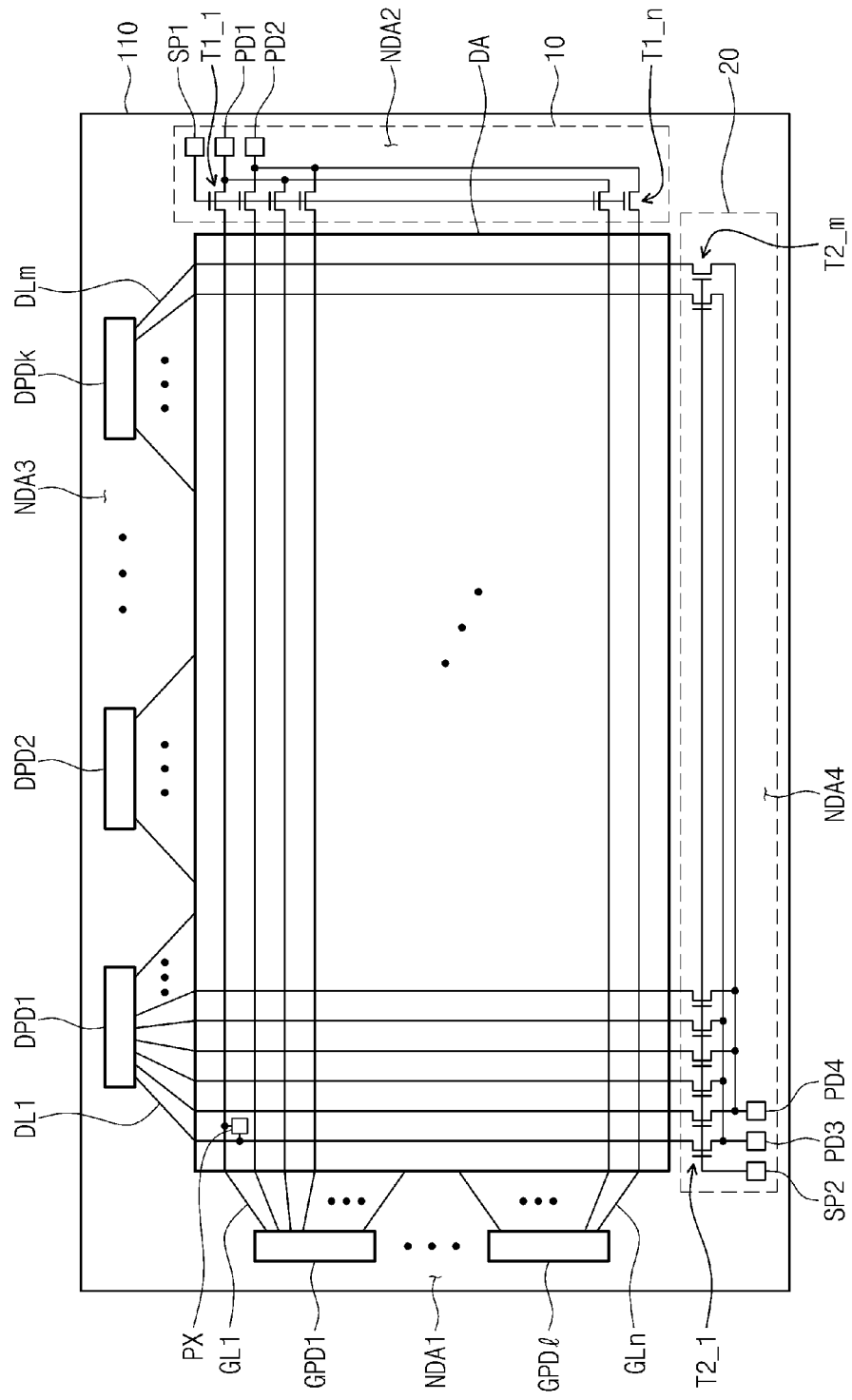
FIG. 1 is a plan view of a thin film transistor substrate, according to exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers and/or regions may be exaggerated for clarity and descriptive purposes. Also, like reference numerals denote like elements.

When an element or layer is referred to as being "on," "connected to," or "coupled to" another element or layer, it may be directly on, directly connected to, or directly coupled to the other element or layer, or intervening elements or layers may be present. When, however, an element is referred to as being "directly on," "directly connected to," or "directly coupled to" another element or layer, there are no intervening elements or layers present. For the purposes of this disclosure, "at least one of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by the use of these terms. These terms are only used to distinguish one element, component, region, layer, or section from another element, component, region, layer, or section. Thus, a first element, component, region, layer, or section that is discussed below could be termed a second, third, etc., element, component, region, layer, or section without departing from the teachings of the present invention.

Spatially relative terms, such as "beneath," "below," "lower," "above," "upper," and the like, may be used herein for descriptive purposes and, thereby, to describe one element or feature's relationship to another element(s) or feature(s) as illustrated in the drawings. It will be understood that the spatially relative terms are intended to encompass different orientations of an apparatus in use and/or operation in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations) and, as such, the spatially relative descriptors used herein are to be interpreted accordingly.

The terminology used herein is for the purpose of describing particular embodiments only and is not intended to be limiting. As used herein, the singular forms, "a," "an," and "the" are intended to include the plural forms as well, unless the context clearly indicates otherwise. Moreover, the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense unless expressly so defined herein.

While exemplary embodiments are described in association with liquid crystal display devices, it is contemplated that exemplary embodiments may be utilized in association with other or equivalent display devices, such as various self-emissive and/or non-self-emissive display technologies. For instance, self-emissive display devices may include organic light emitting displays (OLED), plasma display panels (PDP), etc., whereas non-self-emissive display devices may include electrophoretic displays (EPD), electrowetting displays (EWD), and/or the like.

FIG. 1 is a plan view of a thin film transistor substrate, according to exemplary embodiments.

Referring to FIG. 1, a thin film transistor substrate 110 includes a plurality of gate lines GL1 to GLn, a plurality of data lines DL1 to DLm, a plurality of pixels PX, a first test part 10, and a second test part 20. While specific reference will be made to this particular implementation, it is also contemplated that thin film transistor substrate 110 may embody many forms and include multiple and/or alternative components. For example, it is contemplated that the components of thin film transistor substrate 110 may be combined, located in separate structures, and/or separate locations.

The thin film transistor substrate 110 includes a display area DA and a plurality of non-display areas NDA1, NDA2, NDA3, and NDA4 disposed in the vicinity of the display area DA when viewed in a plan view.

The gate lines GL1 to GLn and the data lines DL1 to DLm are disposed in the display area DA of the thin film transistor substrate 110. The gate lines GL1 to GLn are insulated from the data lines DL1 to DLm while crossing the data lines DL1 to DLm. It is noted that each of "m" and "n" is an integer greater than zero (0).

The pixels PX are disposed in areas defined by the gate lines GL1 to GLn and the data lines DL1 to DLm in the display area DA. The pixels PX are disposed in "n" rows by "m" columns. Each pixel PX is connected to a corresponding gate line of the gate lines GL1 to GLn and a corresponding data line of the data lines DL1 to DLm.

The non-display areas NDA1, NDA2, NDA3, and NDA4 include a first non-display area NDA1 disposed adjacent to a first (e.g., left) side of the display area DA, a second non-display area NDA2 disposed adjacent to a second (e.g., right) side of the display area DA, a third non-display area NDA3 disposed adjacent to a third (e.g., upper) side of the display area DA, and a fourth non-display area NDA4 disposed adjacent to a fourth (e.g., lower) side of the display area DA.

A plurality of gate pad parts GPD1 to GPD1 is disposed in the first non-display area NDA1. It is noted that "1" is an integer greater than zero (0) and smaller than "n." Respective first ends of the gate lines GL1 to GLn are connected to at least one of the gate pad parts GPD1 to GPD1. For instance, the gate lines GL1 to GLn may be extended in the first non-display area NDA1 and connected to at least one of the gate pad parts GPD1 to GPD1. Each of the gate pad parts GPD1 to GPD1 is connected to several gate lines.

According to exemplary embodiments, each of the gate pad parts GPD1 to GPD1 is connected to a corresponding gate driving chip of a plurality of gate driving chips (not shown). The gate driving chips apply gate signals to the gate pad parts GPD1 to GPD1. The gate signals are sequentially applied to the pixels PX, row-by-row, via the gate lines GL1 to GLn, which are connected to the gate pad parts GPD1 to GPD1. The connection between the gate driving chips and the gate lines GL1 to GLn will be described in more detail with reference to FIG. 7.

The first test part 10 is disposed in the second non-display area NDA2 opposite to the first non-display area NDA1. The first test part 10 is connected to respective second ends of the gate lines GL1 to GLn. For instance, the gate lines GL1 to GLn may be extended in the second non-display area NDA2 in a first direction (e.g., row direction) and connected to the first test part 10.

In exemplary embodiments, the first test part 10 includes a plurality of first test transistors T1_1 to T1_$n$, a first switching pad SP1, and a plurality of first test pads PD1 and PD2.

Gate electrodes of the first test transistors T1_1 to T1_$n$ are commonly connected to the first switching pad SP1. Drain electrodes of the first test transistors T1_1 to T1_$n$ are connected to the gate lines GL1 to GLn, respectively.

According to exemplary embodiments, the first test transistors T1_1 to T1_$n$ are divided into a plurality of first groups respectively corresponding to the first test pads PD1 and PD2. Source electrodes of the first test transistors of each first group are commonly connected to a corresponding first test pad of the first test pads PD1 and PD2.

For instance, the first groups include a first sub-group including odd-numbered transistors T1_1, T1_3, . . . , T1_$n$–1 of the first test transistors T1_1 to T1_$n$ and a second sub-group including even-numbered transistors T1_2, T1_4, . . . , T1_$n$ of the first test transistors T1_1 to T1_$n$. The first test pads PD1 and PD2 include a first pad PD1 corresponding to the first sub-group and a second pad PD2 corresponding to the second sub-group. The source electrodes of the first test transistors T1_1, T1_3, . . . , T1_$n$–1 of the first sub-group may be commonly connected to the first pad PD1. The source electrodes of the first test transistors T1_2, T1_4, . . . , T1_$n$ of the second sub-group may be commonly connected to the second pad PD2.

According to exemplary embodiments, the gate lines GL1 to GLn include first gate lines GL1, GL3, . . . , GLn–1 corresponding to odd-numbered gate lines GL1, GL3, . . . , GLn–1 and second gate lines GL2, GL4, . . . , GLn corresponding to even-numbered gate lines GL2, GL4, . . . , GLn. In the second non-display area NDA2, at least some of the second gate lines GL2, GL4, . . . , GLn may be extended longer than at least some of the first gate lines GL1, GL3, . . . , GLn–1 in the first direction.

The drain electrodes of the first test transistors T1_1, T1_3, . . . , T1_$n$–1 of the first sub-group are connected to the first gate lines GL1, GL3, . . . , GLn–1, respectively. The drain electrodes of the first test transistors T1_2, T1_4, . . . , T1_$n$ of the second sub-group are connected to the second gate lines GL2, GL4, . . . , GLn, respectively.

Although only two first groups and two first test pads PD1 and PD2 have been described, it is contemplated that any suitable number of first groups and any suitable number of first test pads may be utilized. To this end, it is also contemplated that the first test transistors T1_1 to T1_$n$ may be divided into two or more first groups. In this manner, the number of first test pads may correspond to the number of first groups.

For instance, the first test transistors T1_1 to T1_n may include first, second, and third transistors in a repeated arrangement. In this manner, the first transistors, the second transistors, and the third transistors may be divided into three first groups, and as such, the thin film transistor substrate 110 may include three first test pads to correspond to the three first groups. That is, each first test pad may be commonly connected to the transistors of a corresponding first group of the three first groups. In addition, the first test transistors T1_1 to T1_n may be commonly connected to one first test pad without being divided into the three first groups.

According to exemplary embodiments, a plurality of data pad parts DPD1 to DPDk is disposed in the third non-display area NDA3. It is noted that "k" is an integer greater than zero (0) and is smaller than "m." Respective first ends of the data lines DL1 to DLm are connected to at least one of the data pad parts DPD1 to DPDk. For instance, the data lines DL1 to DLm may be extended in the third non-display area NDA3 and connected to at least one of the data pad parts DPD1 to DPDk. Each of the data pad parts DPD1 to DPDk is connected to several data lines.

According to exemplary embodiments, each of the data pad parts DPD1 to DPDk is connected to a corresponding source driving chip of a plurality of source driving chips (not shown). The source driving chips apply data voltages to the data pad parts DPD1 to DPDk. The data voltages are applied to the pixels PX via the data lines DL1 to DLm, which are connected to the data pad parts DPD1 to DPDk. The connection between the source driving chips and the data lines DL1 to DLm will be described in more detail with reference to FIG. 7.

The second test part 20 is disposed in the fourth non-display area NDA4 opposite to the third non-display area NDA3. The second test part 20 is connected to respective second ends of the data lines DL1 to DLm. For instance, the data lines DL1 to DLm may be extended in the fourth non-display area NDA4 in a second direction (e.g., column direction) and connected to the second test part 20.

In exemplary embodiments, the second test part 20 includes a plurality of second test transistors T2_1 to T2_m, a second switching pad SP2, and a plurality of second test pads PD3 and PD4.

Gate electrodes of the second test transistors T2_1 to T2_m are commonly connected to the second switching pad SP2. Drain electrodes of the second test transistors T2_1 to T2_m are connected to the data lines DL1 to DLm, respectively.

According to exemplary embodiments, the second test transistors T2_1 to T2_m are divided into a plurality of second groups respectively corresponding to the second test pads PD3 and PD4. Source electrodes of the second test transistors of each second group are commonly connected to a corresponding second test pad of the second test pads PD3 and PD4.

For instance, the second groups include a third sub-group including odd-numbered transistors T2_1, T2_3, . . . , T2_m−1 of the second test transistors T2_1 to T2_n and a fourth sub-group including even-numbered transistors T2_2, T2_4, . . . , T2_m of the second test transistors T2_1 to T2_m. The second test pads PD3 and PD4 include a third pad PD3 corresponding to the third sub-group and a fourth pad PD4 corresponding to the fourth sub-group. The source electrodes of the second test transistors T2_1, T2_3, . . . , T2_m−1 of the third sub-group may be commonly connected to the third pad PD3. The source electrodes of the second test transistors T2_2, T2_4, . . . , T2_m of the fourth sub-group may be commonly connected to the fourth pad PD4.

According to exemplary embodiments, the data lines DL1 to DLm include first data lines DL1, DL3, . . . , DLm−1 corresponding to odd-numbered data lines DL1, DL3, . . . , DLm−1 and second data lines DL2, DL4, . . . , DLm corresponding to even-numbered data lines DL2, DL4, . . . , DLm. In the fourth non-display area NDA4, at least some of the second data lines DL2, DL4, . . . , DLm may be extended longer than at least some of the first data lines DL1, DL3, . . . , DLm−1 in the second direction.

The drain electrodes of the second test transistors T2_1, T2_3, . . . , T2_m−1 of the third sub-group are connected to the first data lines DL1, DL3, . . . , DLm−1, respectively. The drain electrodes of the second test transistors T2_2, T2_4, . . . , T2_n of the fourth sub-group are connected to the second data lines DL2, DL4, . . . , DLm, respectively.

Although only two second groups and two second test pads PD3 and PD4 have been described, it is contemplated that any suitable number of second groups and any suitable number of second test pads may be utilized. To this end, it is also contemplated that the second test transistors T2_1 to T2_m may be divided into two or more second groups. In this manner, the number of second test pads may correspond to the number of second groups.

For instance, the second test transistors T2_1 to T2_m may include first, second, and third transistors in a repeated arrangement. In this manner, the first transistors, the second transistors, and the third transistors may be divided into three second groups, and as such, the thin film transistor substrate 110 may include three second test pads to correspond to the three second groups. That is, each second test pad may be commonly connected to the transistors of a corresponding second group of the three second groups. In addition, the second test transistors T2_1 to T2_m may be commonly connected to one second test pad without being divided into the three second groups.

According to exemplary embodiments, when visual inspection is performed on the thin film transistor substrate 110, a first switching signal may be applied to the first test transistors T1_1 to T1_n via the first switching pad SP1. A second switching signal may be is applied to the second test transistors T2_1 to T2_m via the second switching pad SP2. The first test transistors T1_1 to T1_n may be turned on in response to the first switching signal and the second test transistors T2_1 to T2_m may be turned on in response to the second switching signal. In this manner, a first inspection signal may be applied to the first test pads PD1 and PD2. The turned-on first test transistors T1_1 to T1_n may receive the first inspection signal via the first test pads PD1 and PD2. The first inspection signal may be applied to the gate lines GL1 to GLn via the turned-on first test transistors T1_1 to T1_n.

In exemplary embodiments, the first inspection signal includes a first sub-inspection signal applied to the first pad PD1 and a second sub-inspection signal applied to the second pad PD2. The first sub-inspection signal is applied to the first gate lines GL1, GL3, . . . , GLn−1 connected to the first test transistors T1_1, T1_3, . . . , T1_n−1 of the first sub-group. The second sub-inspection signal is applied to the second gate lines GL2, GL4, . . . , GLn connected to the first test transistors T1_2, T1_4, . . . , T1_n of the second sub-group.

Since the first gate lines GL1, GL3, . . . , GLn−1 receive the first sub-inspection signal and the second gate lines GL2, GL4, . . . , GLn receive the second sub-inspection signal, which may be different from the first sub-inspection signal, a short defect between the first gate lines GL1, GL3, . . . , GLn−1 and the second gate lines GL2, GL4, and GLn may be inspected. It is also noted that open-circuit conditions may be detected.

According to exemplary embodiments, a second inspection signal may be applied to the second test pads PD3 and PD4. The turned-on second test transistors T2_1 to T2_m may receive the second inspection signal via the second test pads PD3 and PD4. The second inspection signal may be applied to the data lines DL1 to DLm via the turned-on second test transistors T2_1 to T2_m.

In exemplary embodiments, the second inspection signal includes a third sub-inspection signal applied to the third pad PD3 and a fourth sub-inspection signal applied to the fourth pad PD4. The third sub-inspection signal may be applied to the first data lines DL1, DL3, . . . , DLm−1 connected to the second test transistors T2_1, T2_3, . . . , T2_m−1 of the third sub-group. The fourth sub-inspection signal may be applied to the second data lines DL2, DL4, . . . , DLm connected to the second test transistors T2_2, T2_4, . . . , T2_m of the fourth sub-group.

Since the first data lines DL1, DL3, . . . , DLm−1 receive the third sub-inspection signal and the second data lines DL2, DL4, . . . , DLm receive the fourth sub-inspection signal, which may be different from the third sub-inspection signal, a short defect between the first data lines DL1, DL3, . . . , DLm−1 and the second data lines DL2, DL4, and DLm may be inspected.

According to exemplary embodiments, the gate lines GL1 to GLn and the data lines DL1 to DLm are grouped into odd-numbered lines and even-numbered lines so that a voltage having a different level may be detected due to different electric potentials of different voltages being applied to the odd-numbered lines and the even-numbered lines when a short defect occurs between lines adjacent to each other in response to the odd-numbered lines being applied with the voltage different from the voltage applied to the even-numbered lines.

In exemplary embodiments, the first inspection signal applied to the first gate lines GL1 to GLn and the second inspection signal applied to the data lines DL1 to DLm form a predetermined resistance image in the display area DA of the thin film transistor substrate 110. As such, visual inspection may be performed by observing the resistance image appearing in the display area DA of the thin film transistor substrate 110 using, for instance, an inspection camera.

Although not shown in figures, during inspection procedures, a probe pin of an auto-probe instrument contacts the first and second switching pads SP1 and SP2 and the first and second test pads PD1 to PD4. In this manner, the first and second switching pads SP1 and SP2 and the first and second test pads PD1 to PD4 receive the first and second switching signals and the first and second inspection signals via the probe pin.

While not illustrated, it is also contemplated that the first test part 10 may be disposed in the first non-display area NDA1 in which the gate pad parts GPD1 to GPD1 are disposed, and the second test part 20 may be disposed in the third non-display area NDA3 in which the data pad parts DPD1 to DPDk are disposed. It is noted, however, that spacing may become an issue in the first and third non-display areas NDA1 and NDA3 in which the gate pad parts GPD1 to GPD1 and the data pad parts DPD1 to DPDk are disposed. That is, extraneous non-display area available for the first and second test parts 10 and 20 in the first and third non-display areas NDA1 and NDA3 may not be enough to accommodate the first and second test parts 10 and 20. While the size of the first and third non-display areas NDA1 and NDA3 may be increased to respectively accommodate the first and second test parts 10 and 20, this may not be desirable, as an overall size of the thin film transistor substrate 110 may be increased or the display area DA may not be desirably positioned (e.g., centered) between the first to fourth non-display areas NDA1 to NDA4.

According to exemplary embodiments, however, the first test part 10 is disposed in the second non-display area NDA2 in which the gate pad parts GPD1 to GPD1 are not disposed. To this end, the second test part 20 is disposed in the fourth non-display area NDA4 in which the data pad parts DPD1 to DPDk are not disposed. As such, the first and second test pads 10 and 20 used to perform visual inspection may be effectively arranged using extraneous non-display areas without increasing the overall size of the thin film transistor substrate 110 or affecting the spatial positioning of a display area of the thin film transistor substrate 110.

Figure 2A:
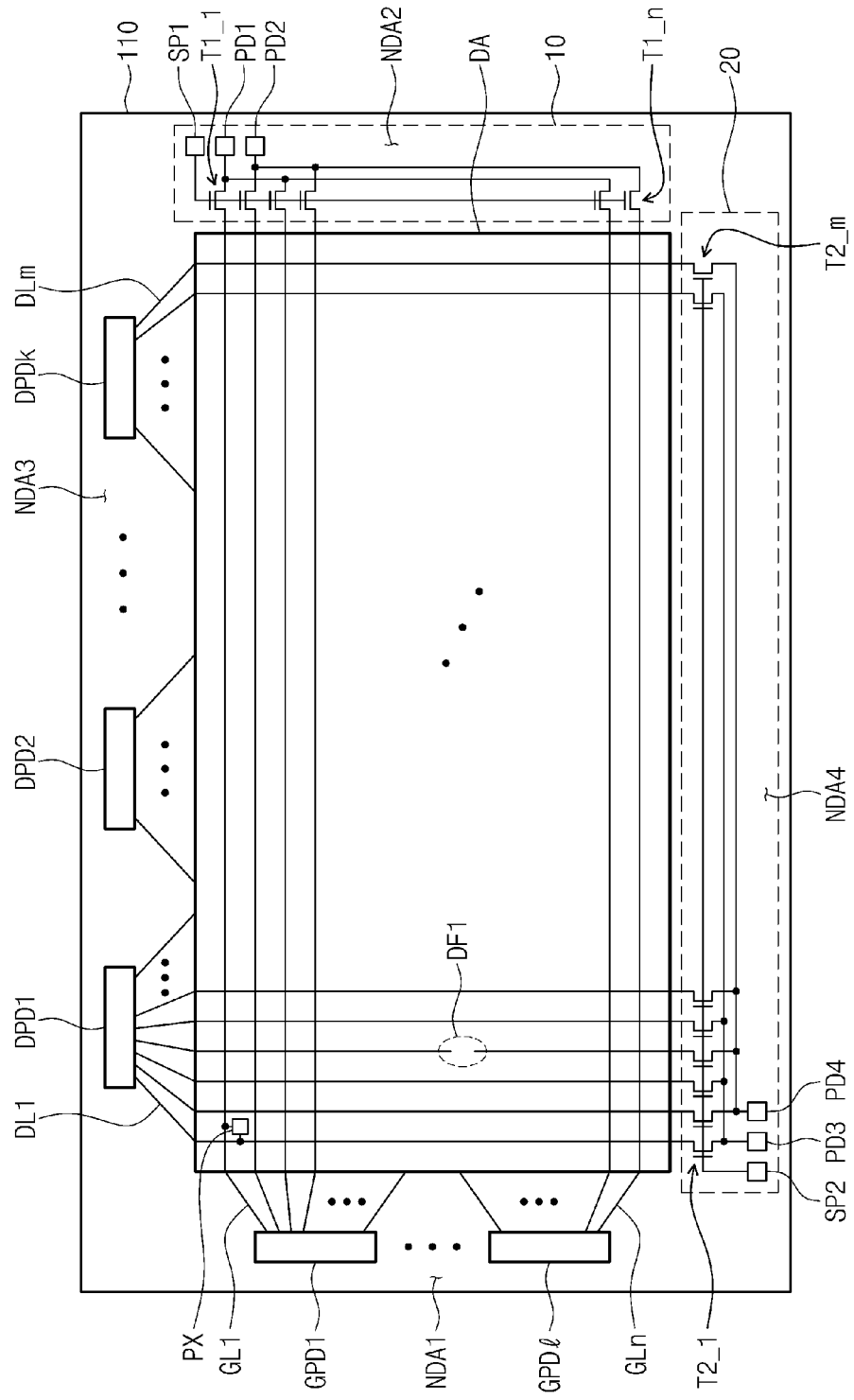
FIGS. 2A-2C are respective plan views including defects in a thin film transistor substrate, according to exemplary embodiments.
Figure 2B:
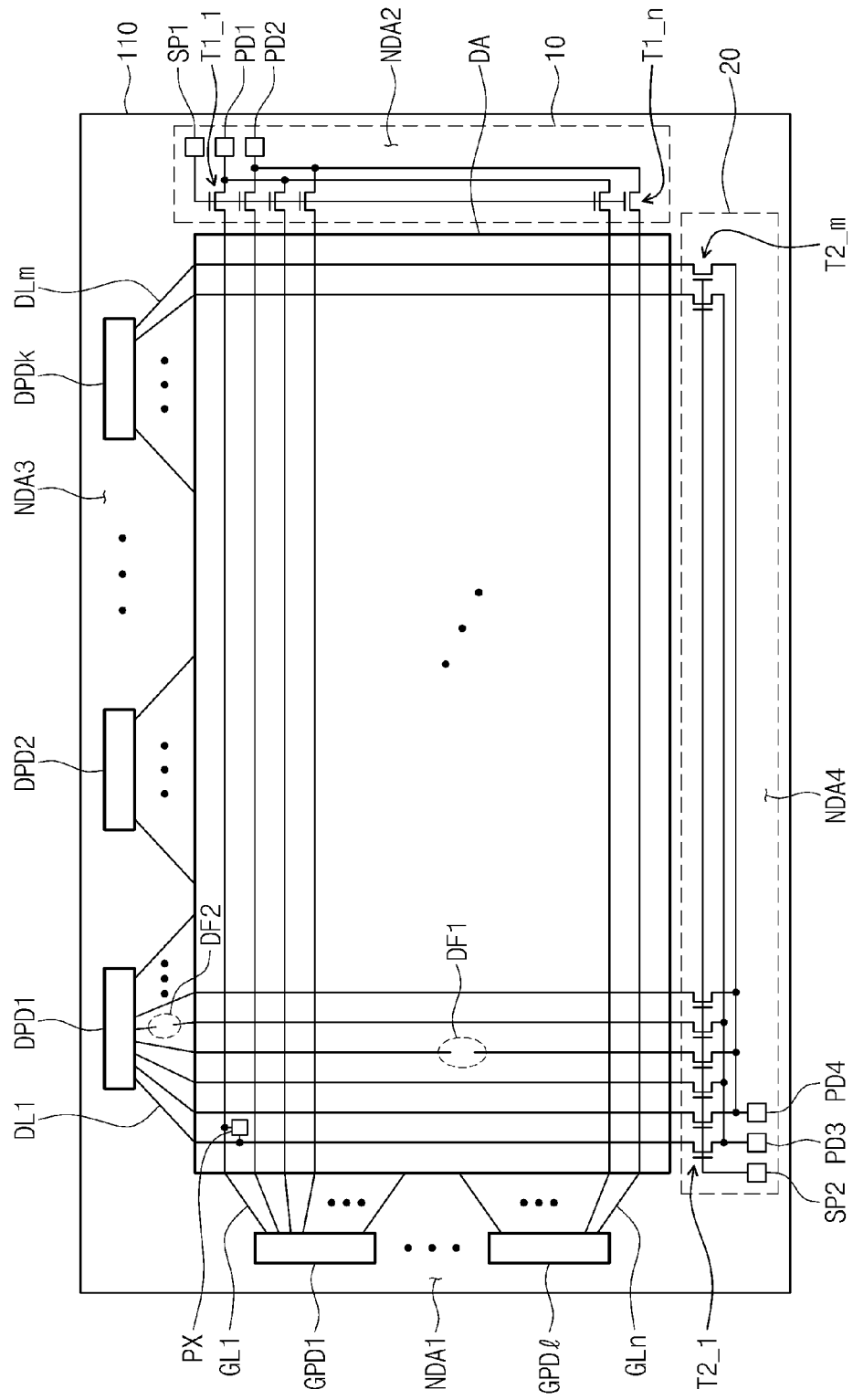
Figure 2C:
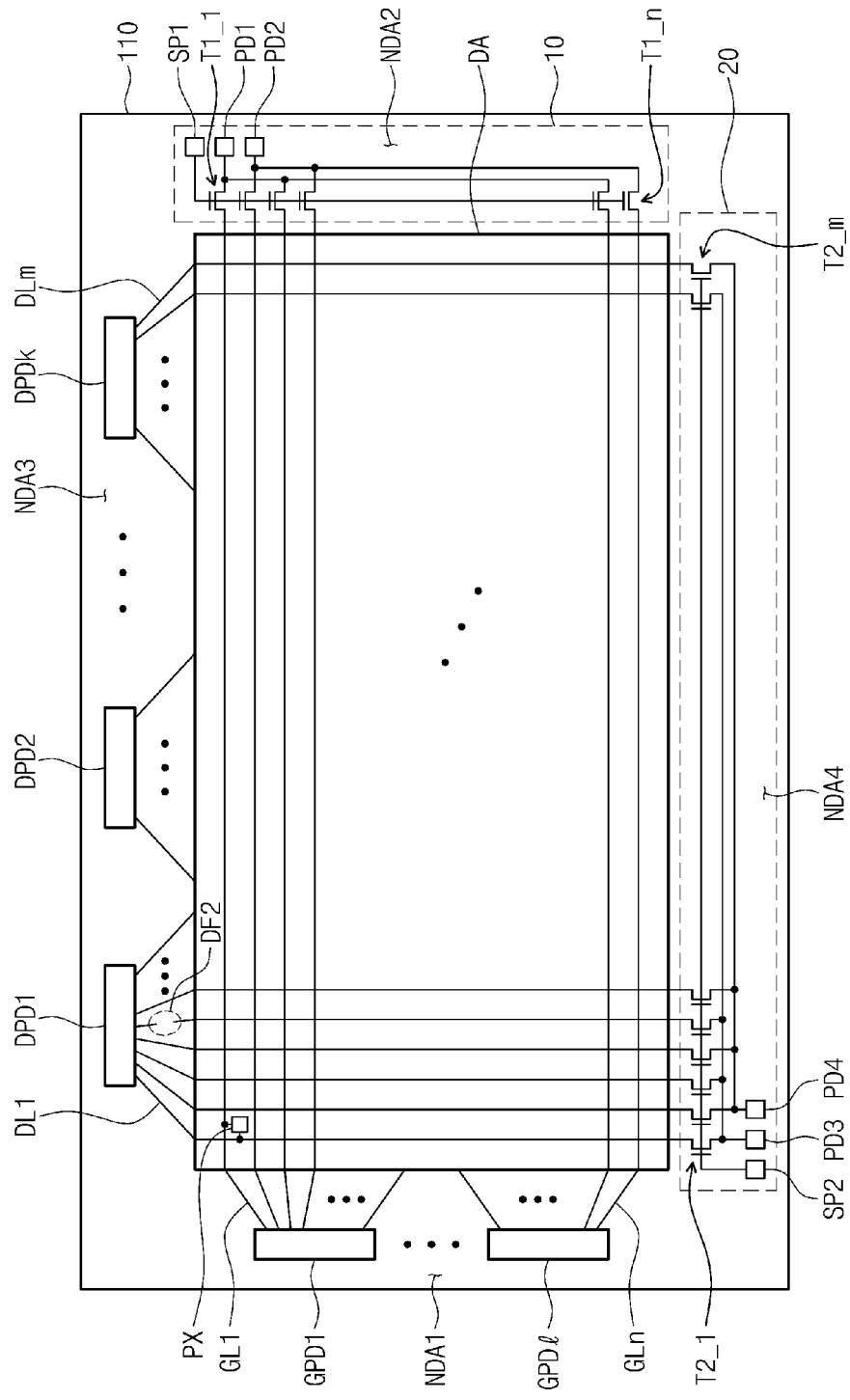

FIGS. 2A-2C are respective plan views including defects in a thin film transistor substrate, according to exemplary embodiments.

Referring to FIG. 2A, a first defect DF1 may exist on one of the data lines DL1 to DLm in the display area DA. As such, the first defect DF1 may be detected by the aforementioned visual inspection technique.

Referring to FIG. 2B, a first defect DF1 may exist on one of the data lines DL1 to DLm in the display area DA and a second defect DF2 may exist on one of the data lines DL1 to DLm in the third non-display area NDA3.

The first defect DF1 occurring on the data line in the display area DA is detected by visual inspection, but defects occurring in the first to fourth non-display areas NDA1 to NDA4 is not detected. Accordingly, the second defect DF2 occurring on the data line in the third non-display area NDA3 is not detected by visual inspection.

Referring to FIG. 2C, a second defect DF2 may exist on the data line in the third non-display area NDA3. In this manner, although visual inspection may be performed on the thin film transistor substrate 110, the thin film transistor substrate 110 may be considered free of defects since no defects exist in the display area DA. This would relate to a false-positive, as the second defect DF2 exists in the third non-display area NDA3.

Accordingly, based on the aforementioned visual inspect technique, defects occurring in the data lines DL1 to DLm have been described. It is noted that defects occurring in the gate lines GL1 to GLn in the display area DA may be similarly detected via visual inspection based on utilization of test part 20. However, like defects in the data lines DL1 to DLm occurring in the third non-display area NDA3, defects occurring in the gate lines GL1 to GLn in the first non-display area NDA1 may be not detected even though visual inspection is performed on the thin film transistor substrate 110.

The area of the first non-display area NDA1, in which the gate lines GL1 to GLn are disposed, and the area of the third non-display area NDA3, in which the data lines DL1 to DLm are disposed, may be referred to as "fan-out" areas.

An inspection apparatus utilized to detect defect in the gate lines GL1 to GLn and the data lines DL1 to DLm in the fan-out areas will be described in association with FIGS. 3 and 4.

Figure 3:
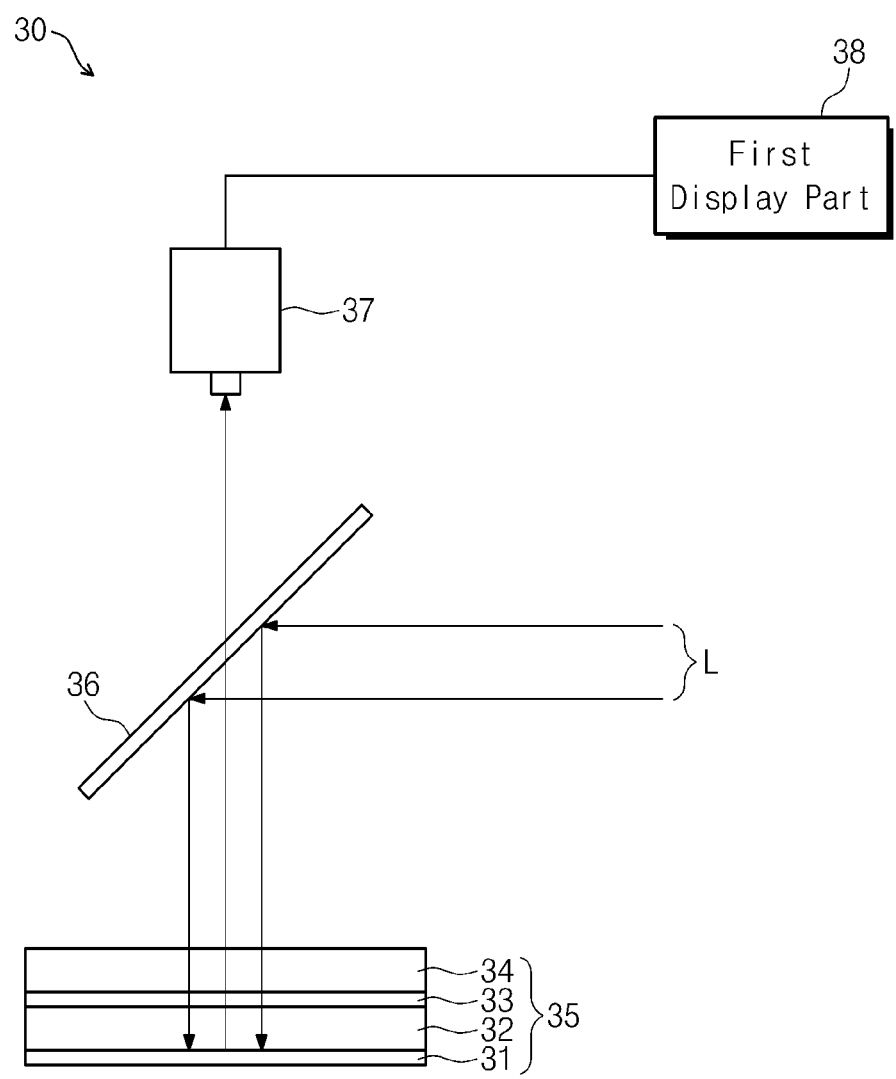
FIG. 3 is a block diagram of an inspection apparatus to detect defects in a fan-out area of the thin film transistor substrate of FIG. 1, according to exemplary embodiments.

FIG. 3 is a block diagram of an inspection apparatus to detect defects in a fan-out area of the thin film transistor substrate of FIG. 1, according to exemplary embodiments.

Referring to FIG. 3, an inspection apparatus 30 includes a modulator 35, a light direction control device 36, a camera 37, and a first display part 38. While specific reference will be made to this particular implementation, it is also contemplated that inspection apparatus 30 may embody many forms and include multiple and/or alternative components. For example, it is contemplated that the components of inspection apparatus 30 may be combined, located in separate structures, and/or separate locations.

The modulator 35 is disposed in the fan-out area of the thin film transistor substrate 110, which is to be inspected. For example, the modulator 35 may be disposed on the data lines DL1 to DLm of the third non-display area NDA3. The modulator 35 is spaced apart from the data lines DL1 to DLm of the third non-display area NDA3 at a predetermined distance. In addition, the modulator 35 may be disposed on the gate lines GL1 to GLn of the first non-display area NDA1. As such, the modulator 35 may be spaced apart from the gate lines GL1 to GLn of the first non-display area NDA1 at a predetermined distance.

The light direction control device 36 may be, for instance, a beam splitter. That is, light L provided to the inspection apparatus 30 may be reflected by the light direction control device 36 and made incident to the modulator 35. The light L incident to the modulator 35 may be reflected by the modulator 35 to propagate back towards the light direction control device 36. As such, the light L propagating from the modulator 35 may pass through the light direction control device 36, and thereby, provided to the camera 37.

The camera 37 detects the light L reflected from the modulator 35 and the detected result may be provided to the first display part 38. The first display part 38 displays the detected result.

The modulator 35 includes a reflective layer 31, a liquid crystal layer 32, a transparent electrode layer 33, and a transparent substrate 34. The reflective layer 31 and the transparent electrode layer 33 are disposed to face each other. The reflective layer 31 is spaced apart from the gate lines GL1 to GLn and the data lines DL1 to DLm of the first and third non-display areas NDA1 and NDA3. The liquid crystal layer 32 is disposed between the reflective layer 31 and the transparent electrode layer 33. The transparent substrate 34 is disposed on the transparent electrode layer 33.

The light L incident to the modulator 35 is reflected by the reflective layer 31 of the modulator 35 and exits the modulator 35 in an opposite direction, i.e., the reflected light is reflected back towards the light direction control device 36.

The transparent electrode layer 33 of the modulator 35 includes a transparent conductive material, e.g., aluminum zinc oxide, gallium zinc oxide, indium tin oxide, indium zinc oxide, carbon nano tube, etc. It is also contemplated that one or more transparent conductive polymers (ICP) may be utilized, such as, for example, polyaniline, poly(3,4-ethylenedioxythiophene) poly(styrenesulfonate) (PEDOT:PSS), etc. The transparent electrode layer 33 receives a determined voltage to form an electric field in cooperation with the data lines DL1 to DLm of the third non-display area NDA3 of the thin film transistor substrate 110. In addition, the transparent electrode layer 33 receives a determined voltage to form an electric field in cooperation with the gate lines GL1 to GLn of the first non-display area NDA1 of the thin film transistor substrate 110.

According to exemplary embodiments, the liquid crystal layer 32 transmits the light L in response to the electric field. As an example, the liquid crystal layer 32 may be a polymer-dispersed liquid crystal. The liquid crystal layer 32 is formed by coating a liquid crystal solution including polymer and liquid crystals on a transparent substrate and curing the coated liquid crystal solution. A transmittance of the light L passing through the liquid crystal layer 32 changes in accordance with the electric field.

Figure 4:
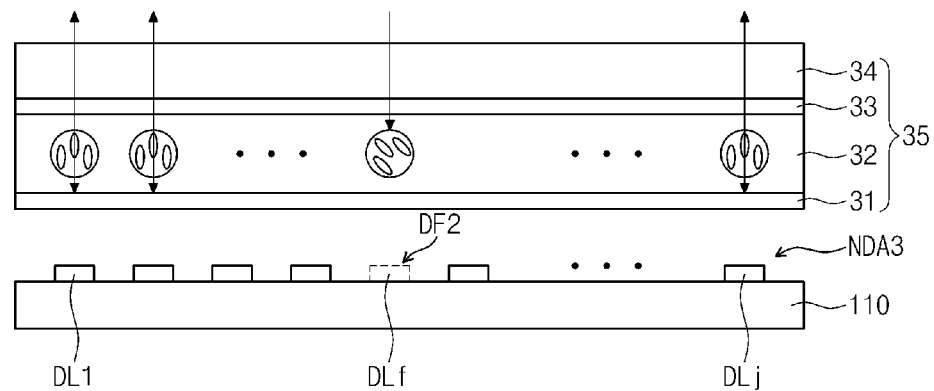
FIG. 4 illustrates a method of detecting defects in a fan-out area of the thin film transistor substrate of FIG. 1 using the inspection apparatus of FIG. 3, according to exemplary embodiments.

FIG. 4 illustrates a method of detecting defects in a fan-out area of the thin film transistor of FIG. 1 using the inspection apparatus of FIG. 3, according to exemplary embodiments.

Referring to FIG. 4, the modulator 35 of the inspection apparatus 30 is disposed on several data lines DL1 to DLj among the data lines DL1 to DLm disposed in the third non-display area NDA3. It is noted that "j" is an integer greater than zero (0) and smaller than "m." As an example, the modulator 35 may be disposed on the data lines DL1 to DLj connected to the first data pad part DPD1.

In exemplary embodiments, the second inspection signal is applied to the data lines DL1 to DLj, via the second test part 20, and the predetermined voltage is applied to the transparent electrode layer 33. Accordingly, an electric field may be formed between the data lines in a normal state (e.g., a "no defect" state) among the data lines DL1 to DLj disposed in association with the transparent electrode layer 33 and disposed in the third non-display area NDA3.

Among the data lines DL1 to DLj disposed in the third non-display area NDA3, the second defect DF2 may exist on the data line DLf. Due to the second defect DF2, the second inspection signal is not applied (or is applied differently than expected) to the data line DLf on which the second defect DF2 exists. In this manner, the electric field may not be formed (or may be differently formed than expected) between the data line DLf and the transparent electrode layer 33.

According to exemplary embodiments, molecules of the liquid crystal layer 32 are aligned in a uniform direction based on the electric field being formed between the transparent electrode layer 33 and the non-defective data lines disposed in the third non-display area NDA3. As such, the light L is transmitted through the liquid crystal layer 32. As a result, the light L incident to the modulator 35 is reflected by the reflective layer 31 and exits from the modulator 35.

In exemplary embodiments, however, since the electric field is not formed (or is differently formed) between the transparent electrode layer 33 and the data line DLf in which the second defect DF2 is present, the alignment of those molecules of the liquid crystal layer 32 is not changed (or is changed in an unexpected manner). As such, the light L traveling to the data line DLf may not be transmitted through (or may be partially transmitted through) the liquid crystal layer 32. As a result, the light L traveling to the data line DLf after being incident to the modulator 35 does not exit from the modulator 35 or exists from the modulator 35 in an unexpected manner, e.g., partially polarized.

The light L exiting from the modulator 35 passes through the light direction control device 36 and is provided to the camera 37. The result detected by the camera 37 is provided to the first display part 38. The first display part 38 displays the result detected by the camera 37 to indicate, for example, that the data line DLf is in an abnormal state (e.g., a "defect" state).

According to exemplary embodiments, the inspection apparatus 30 detects whether a defect exists in the data lines DL1 to DLj connected to the first data pad part DPD1 of the third non-display area NDA3 based on the light L reflected from the modulator 35, and then moves to other data lines to be inspected to continue performing the visual inspection. In this manner, the inspection apparatus 30 may sequentially move from the first data pad part DPD1 to the k-th data pad part DPDk to inspect whether any defects exist on the data lines DL1 to DLm disposed in the third non-display area NDA3. It is also contemplated that the modulator 35 may be configured to facilitate visual inspect of any suitable number of data lines and/or gates lines, such that all or some of the data lines and/or gates lines may be visually inspected at once.

Accordingly, it is noted that the method of inspecting for defects in the data lines DL1 to DLm disposed in the third non-display area NDA3 using the inspection apparatus 30 without making contact with the data lines DL1 to DLm may be referred to as a non-contact method or non-contact inspection method. As such, defects in the data lines DL1 to DLm disposed in the third non-display area NDA3 may be detected by a non-contact method.

In exemplary embodiments, the inspection method to detect the presence of defects in the data lines DL1 to DLm disposed in the third non-display area NDA3 may be similarly utilized to detect the presence of defects in the gate lines GL1 to GLn disposed in the first non-display area NDA1 and connected to the gate pad parts GPD1 to GPD1. For instance, after the defects in the data lines DL1 to DLm disposed in the third non-display area NDA3 are inspected using the inspection apparatus 30, the defects in the gate lines GL1 to GLn disposed in the first non-display area NDA1 may be inspected in a similar manner utilizing first test part 10 instead of second test part 20.

It is noted, however, that the order of inspecting the data lines DL1 to DLm disposed in the third non-display area NDA3 and the gate lines GL1 to GLn disposed in the first non-display area NDA1 may be modified. Additionally (or alternatively), inspection of the data lines DL1 to DLm disposed in the third non-display area NDA3 and the gate lines GL1 to GLn disposed in the first non-display area NDA1 may be substantially simultaneously performed using a plurality of inspection apparatuses 30 and/or using a plurality of modulators 35.

According to exemplary embodiments, visual inspection may be performed to detect defects in the gate lines GL1 to GLn and the data lines DL1 to DLm disposed in the display area DA, whereas the aforementioned non-contact inspection may be utilized to detect defects in the gate lines GL1 to GLn and the data lines DL1 to DLm disposed in the first and third non-display areas NDA1 and NDA3 using the inspection apparatus 30.

Figure 5:
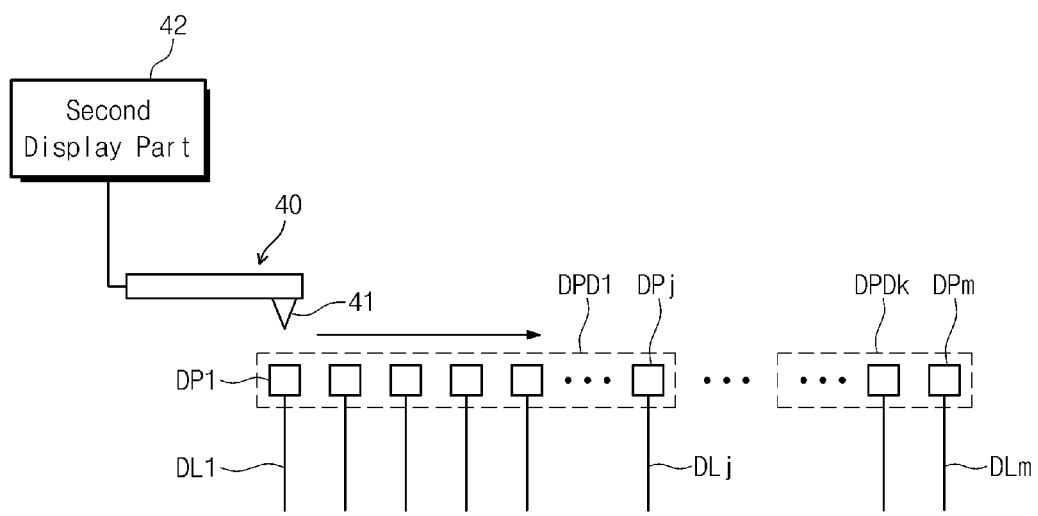
FIG. 5 illustrates a method of detecting defects in a fan-out area using an inspection apparatus, according to exemplary embodiments.

FIG. 5 illustrates a method of detecting defects in the fan-out area of the thin film transistor substrate of FIG. 1 using an inspection apparatus, according to exemplary embodiments.

Referring to FIG. 5, the data pad parts DPD1 to DPDk include a plurality of data pads DP1 to DPm. The data pads PD1 to DPm are connected to the data lines DL1 to DLm, respectively.

According to exemplary embodiments, the inspection apparatus 40 may be manipulated to contact the data pads DP1 to DPm disposed in the third non-display area NDA3. In this manner, the inspection apparatus 40 may include a probe 41 to make the contacts. For instance, the probe 41 may make contact with a first data pad DP1 to inspect data line DL1. In this manner, the inspection apparatus 40 may move to an m-th data pad DPm, such that the probe 41 makes contact with the m-th data pad DPm. As such, the probe 41 may sequentially make contact with the data pads DP1 to DPm, and thereby, enable the inspection apparatus 40 to inspect data lines DL1 to DLm. It is also contemplated that inspection apparatus 40 may include any suitable number of probes 41 to simultaneously or iteratively inspect a corresponding number of data lines and/or gate lines. To this end, it is also contemplated that inspection apparatus 40 may embody many forms and include multiple and/or alternative components. For example, it is contemplated that the components of inspection apparatus 40 may be combined, located in separate structures, and/or separate locations.

According to exemplary embodiments, the second test part 20 is utilized to apply the second inspection signal to the data lines DL1 to DLm. The inspection apparatus 40 detects the second inspection signal output from the data pads DP1 to DPm respectively connected to the data lines DL1 to DLm to determine the presence of defects in the data lines DL1 to DLm.

In exemplary embodiments, when the second inspection signal is output from the data pads DP1 to DPm in normal state (e.g., a "no-defect" state), the data lines DL1 to DLm disposed in the third non-display area NDA3 are determined to be in a normal state (e.g., "no defect" state). However, when a defect exists in a data line disposed in the third non-display area NDA3, the second inspection signal is not output in normal state, e.g., not output or output in an unexpected manner. Accordingly, the data line in which a defect exists may be detected in the third non-display area NDA3. The result whether a defect exists in a data line is displayed via a second display part 42, which is associated with the inspection apparatus 40.

Accordingly, it is noted that the method of inspecting for defects in the data lines DL1 to DLm disposed in the third non-display area NDA3 using the inspection apparatus 40, which makes contact with the data lines DL1 to DLm (or data pads DP1 to DPm) may be referred to as a contact method or a contact inspection method. As such, defects in the data lines DL1 to DLm disposed in the third non-display area NDA3 may be detected by a contact method.

According to exemplary embodiments, the inspection method to detect the presence of defects in the data lines DL1 to DLm disposed in the third non-display area NDA3 may be utilized to detect the presence of defects in the gate lines GL1 to GLn disposed in the first non-display area NDA1 and connected to the gate pad parts GPD1 to GPD1. For instance, after the defects in the data lines DL1 to DLm disposed in the third non-display area NDA3 are inspected using the inspection apparatus 40, the defects in the gate lines GL1 to GLn disposed in the first non-display area NDA1 may be inspected in a similar manner utilizing first test part 10 instead of second test part 20. For instance, the gate pad parts GPD1 to GPD1 include a plurality of gate pads (not shown) and the gate pads are connected to the gate lines GL1 to GLn, respectively. The inspection apparatus 40 may sequentially make contact with the gate pads in the first non-display area NDA1 to inspect whether defects exist in the gate lines GL1 to GLn.

It is noted that the order of inspecting the data lines DL1 to DLm disposed in the third non-display area NDA3 and the gate lines GL1 to GLn disposed in the first non-display area NDA1 may be modified. Additionally (or alternatively), inspection of the data lines DL1 to DLm disposed in the third non-display area NDA3 and the gate lines GL1 to GLn disposed in the first non-display area NDA1 may be substantially simultaneously performed using a plurality of inspection apparatuses 40 and/or using a plurality of probes 41.

According to exemplary embodiments, visual inspection may be performed to detect defects in the gate lines GL1 to GLn and the data lines DL1 to DLm respectively disposed in the display area DA, whereas the aforementioned contact inspection may be utilized to detect defects in the gate lines GL1 to GLn and the data lines DL1 to DLm disposed in the first and third non-display areas NDA1 and NDA3 using the inspection apparatus 40.

Figure 6:
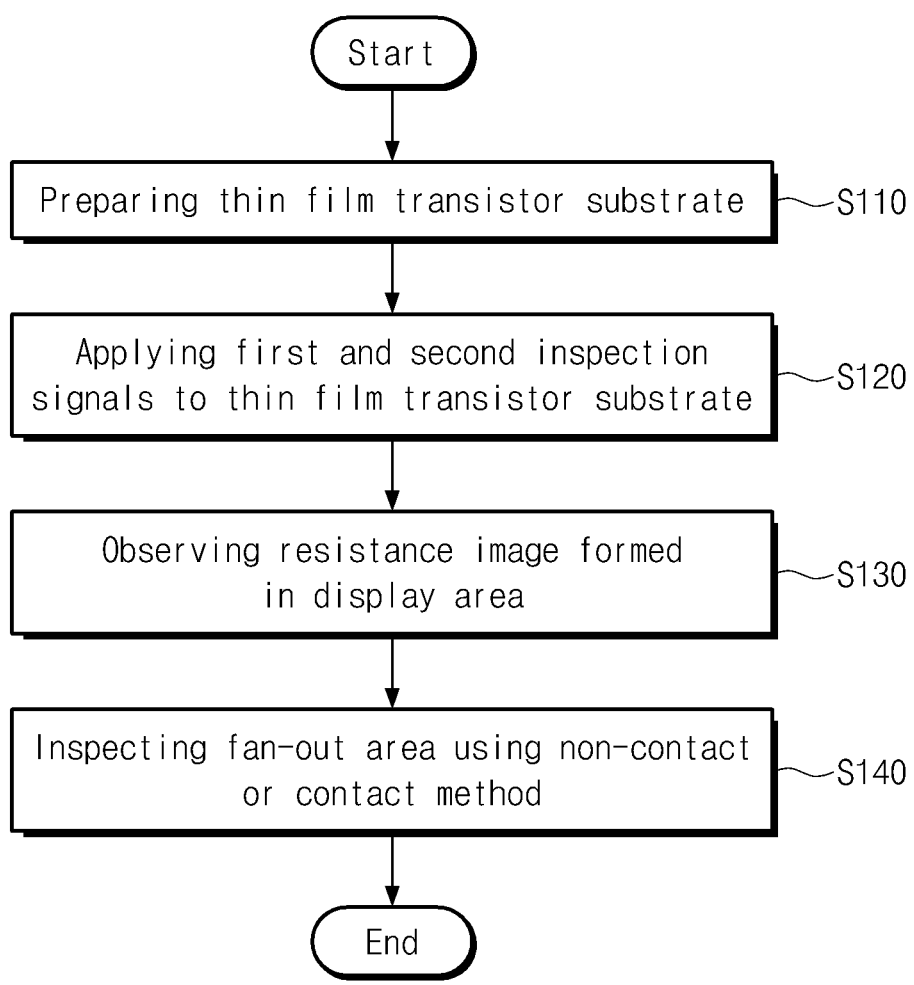
FIG. 6 is a flowchart of a process to visually inspect the thin film transistor substrate of FIG. 1, according to exemplary embodiments.

FIG. 6 is a flowchart of a process to visually inspect the thin film transistor substrate of FIG. 1, according to exemplary embodiments.

Referring to FIG. 6, the thin film transistor substrate 110 shown in FIG. 1 is prepared (S 110). The thin film transistor substrate 110 includes the structure as described above in association with FIG. 1.

The first inspection signal and the second inspection signal are applied to the thin film transistor substrate 110 (S 120). That is, the first inspection signal is applied to the gate lines GL1 to GLn via the first test part 10 of the thin film transistor substrate 110, and the second inspection signal is applied to the data lines DL1 to DLm via the second test part 20 of the thin film transistor substrate 110.

A resistance image, which is formed by applying the first and second inspection signals to the corresponding first and second test parts 10 and 20, is displayed in the display area DA and defects in the display area DA may be detected by observing the resistance image (S130). As such, the defects in the display area DA may be detected via visual inspection.

The gate lines GL1 to GLn and the data lines DL1 to DLm of the fan-out areas are inspected based on at least one of the non-contact method and the contact method (S 140). For instance, defects in the gate lines GL1 to GLn of the first non-display area NDA1 and the data lines DL1 to DLm of the third non-display area NDA3 may be detected using the inspection apparatus 30 based on the non-contact method and/or the inspection apparatus 40 based on the contact method.

When, for example, the inspection apparatus 30 associated with the non-contact method is used, the inspection apparatus 30 may be sequentially disposed on the data lines DL1 to DLm of the third non-display area NDA3 and the gate lines GL1 to GLn of the first non-display area NDA1. The data lines DL1 to DLm of the third non-display area NDA3 may be inspected on the basis of an electric field formed between the inspection apparatus 30 and the data lines DL1 to DLm of the third non-display area NDA3. Similarly, the gate lines GL1 to GLn of the first non-display area NDA1 may be inspected on the basis of an electric field formed between the inspection apparatus 30 and the gate lines GL1 to GLn of the first non-display area NDA1. It is noted that the inspection apparatus 30 includes a structure as described in association with FIG. 3.

When, for example, the inspection apparatus 40 associated with the contact method is used, the inspection apparatus 40 may sequentially make contact with the data pads DP1 to DPm connected to the data lines DL1 to DLm of the third non-display area NDA3 and the gate pads connected to the gate lines GL1 to GLn of the first non-display area NDA1. The inspection apparatus 40 may detect the output signal from the data pads DP1 to DPm to determine whether defects exist in the data lines DL1 to DLm of the third non-display area NDA3. Similarly, the inspection apparatus 40 may detect the output signal from the gate pads to determine whether defects exist in the gate lines GL1 to GLn of the first non-display area NDA1. It is noted that the inspection apparatus 40 includes a structure as described in association with FIG. 5.

Accordingly, the presence of defects in the display area DA may be detected via the visual inspection method, and the presence of defects in the gate lines GL1 to GLn and the data lines DL1 to DLm in the fan-out areas may be detected via at least one of the non-contact method and the contact method.

Figure 7:
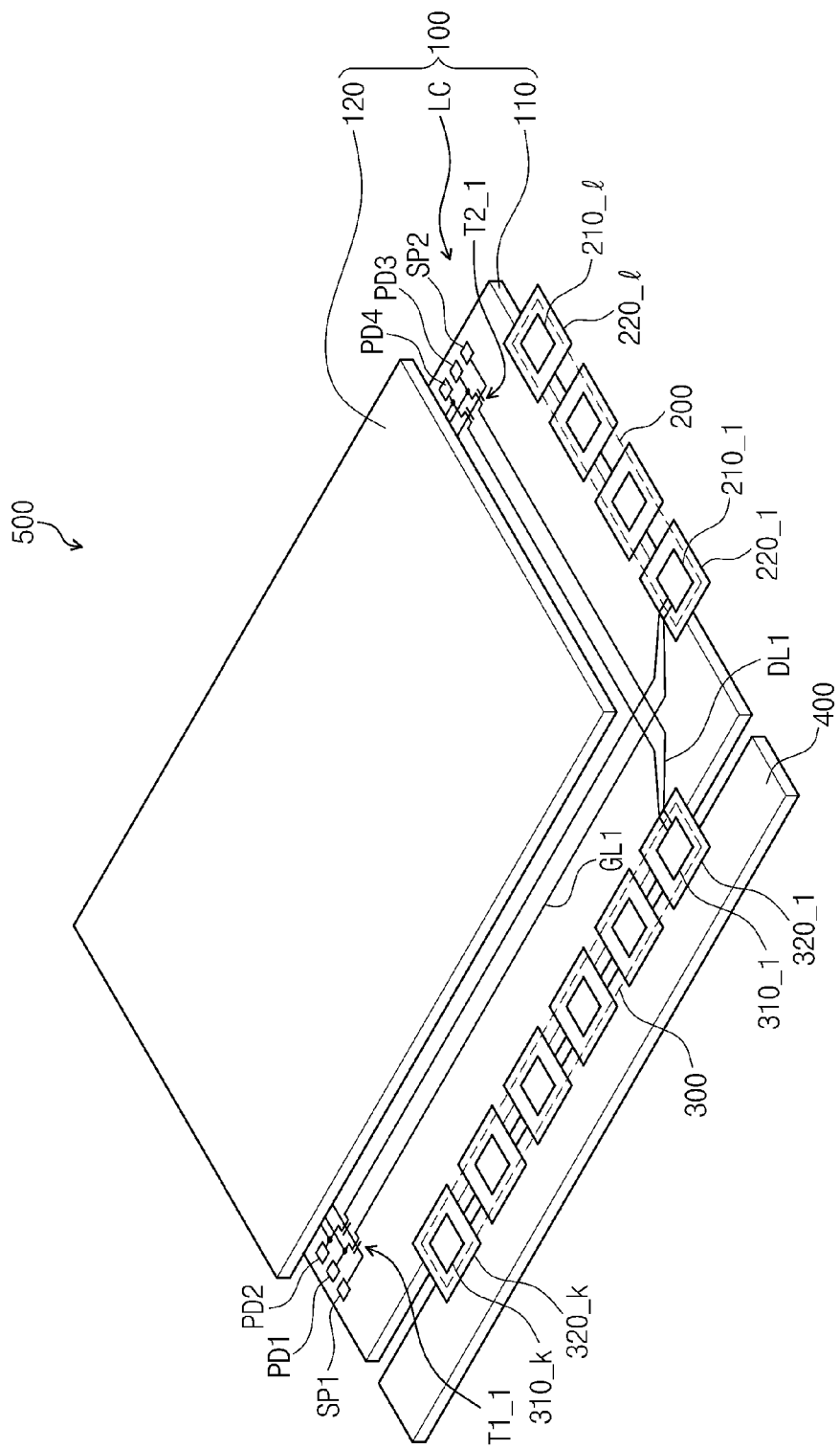
FIG. 7 is a perspective view of a display device including the thin film transistor substrate of FIG. 1, according to exemplary embodiments.

FIG. 7 is a perspective view of a display device including the thin film transistor substrate of FIG. 1, according to exemplary embodiments. For descriptive purposes, the display device is described as corresponding to a liquid crystal display device, however, it is contemplated that the display device may relate to any one or more of the aforementioned self-emissive and non-self-emissive display devices.

Referring to FIG. 7, the liquid crystal display 500 includes a display panel 100, a gate driver 200, a data driver 300, and a driving circuit substrate 400. While specific reference will be made to this particular implementation, it is also contemplated that liquid crystal display device 500 may embody many forms and include multiple and/or alternative components. For example, it is contemplated that the components of liquid crystal display device 500 may be combined, located in separate structures, and/or separate locations.

The display panel 100 includes the thin film transistor 110 in which the pixels PX are disposed, a color filter substrate 120, on which color filters are disposed, facing the thin film transistor substrate 110, and a liquid crystal layer LC disposed between the thin film transistor substrate 110 and the color filter substrate 120.

The thin film transistor substrate 110 includes a plurality of pixel electrodes (not shown) respectively corresponding to the pixels PX and a plurality of thin film transistors (not shown) each being connected to a corresponding pixel electrode of the pixel electrodes. The thin film transistors receive data voltages provided through the data lines DL1 to DLm in response to gate signals provided through the gate lines GL1 to GLn. The data voltages are applied to the pixel electrodes, respectively.

The gate driver 200 generates the gate signals in response to a gate control signal provided from a timing controller (not shown) mounted on, for instance, the driving circuit substrate 400. The gate signals are sequentially applied, row-by-row, to the pixels PX through the gate lines GL1 to GLn. Although not shown in figures, the gate control signal may be applied to the gate driver 200 through a second flexible printed circuit board 320_1 disposed at, for example, a side (e.g., a leftmost side) among second flexible printed circuit boards 320_1 to 320_k.

The gate driver 200 includes a plurality of gate driving chips 210_1 to 210_1. The gate driving chips 210_1 to 210_1 are respectively disposed (e.g., mounted) on first flexible printed circuit boards 220_1 to 220_1 and connected to the gate pad parts GPD1 to GPD1 of the first non-display area NDA1 shown in FIG. 1. Although not shown in figures, the first flexible printed circuit boards 220_1 to 220_1, on which the gate driving chips 210_1 to 210_1 are respectively disposed, may be connected to the gate pad parts GPD1 to GPD1, respectively, through anisotropic conductive films.

The gate driving chips 210_1 to 210_1 of the gate driver 200 generate the gate signals in response to the gate control signal. The gate driving chips 210_1 to 210_1 sequentially apply the gate signals to the pixels PX, row-by-row.

The data driver 300 receives image signals and a data control signal from the timing controller. The data driver 300 generates analog data voltages corresponding to the image signals in response to the data control signal. The data driver 300 applies the data voltages to the pixels PX through the data lines DL1 to DLm.

The data driver 300 includes a plurality of source driving chips 310_1 to 310_k. The source driving chips 310_1 to 310_k are disposed (e.g., mounted) on the second flexible printed circuit boards 320_1 to 320_k, respectively, and connected to the driving circuit substrate 400 and the data pad parts DPD1 to DPDk of the third non-display area NDA3 shown in FIG. 1. Although not shown in figures, the second flexible printed circuit boards 320_1 to 320_k, on which the source driving chips 310_1 to 310_k are respectively disposed, may be connected to the data pad parts DPD1 to DPDk, respectively, through anisotropic conductive films.

According to exemplary embodiments, the gate driving chips 210_1 to 210_1 and the source driving chips 310_1 to 320_k are mounted on the first and second flexible printed circuit boards 220_1 to 220_1 and 320_1 to 320_k via, for instance, a tape carrier package (TCP) scheme, but any other suitable scheme may be utilized. That is, the gate driving chips 210_1 to 210_1 and the source driving chips 310_1 to 320_k may be mounted on the first non-display area NDA1 and the third non-display area NDA3 by a chip-on-glass (COG) scheme.

The thin film transistor substrate 110 is configured as described in association with FIG. 1.

Although not shown in figures, color filters may be disposed on the color filter substrate 120. Each color filter includes a color pixel to represent one of, for instance, red, green, and blue colors; however, any other suitable color may be utilized. In addition, although not shown in figures, the liquid crystal display 500 includes a backlight unit disposed at a rear side of the display panel 100 to supply light to the display panel 100. The backlight unit may be a direct illumination type backlight unit or an edge illumination type backlight unit.

Utilizing the thin film transistors of the thin film transistor substrate 110, the data voltages are applied to the pixel electrodes and a common voltage is applied to a common electrode (not shown). The arrangement of liquid crystal molecules of the liquid crystal layer LC may be changed based on an electric field generated between the common electrode and the pixel electrodes, and thereby, imposed upon the liquid crystal layer LC. The transmittance of light provided from the backlight unit and passing through the liquid crystal layer LC is controlled by the arrangement of the liquid crystal molecules, which facilitates displaying a desired image.

The first test part 10 of the thin film transistor substrate 110 is disposed in the second non-display area NDA2 in which the gate pad parts GDP1 to GDP1 are not disposed. In addition, the second test part 20 is disposed in the fourth non-display area NDA4 in which the data pad parts DPD1 to DPDk are not disposed. As such, the liquid crystal display 500 including the thin film transistor substrate 110 may effectively place the first and second test pads 10 and 20 used to perform visual inspection using the non-display areas without spatial limitation.

According to exemplary embodiments, defects in the display area DA may be detected by the visual inspection method and defects in the gate lines GL1 to GLn and the data lines DL1 to DLm in the fan-out areas may be detected by at least one of the non-contact and the contact method.

While certain exemplary embodiments and implementations have been described herein, other embodiments and modifications will be apparent from this description. Accordingly, the invention is not limited to such embodiments, but rather to the broader scope of the presented claims and various obvious modifications and equivalent arrangements.

What is claimed is:

1. A thin film transistor substrate, comprising:
a plurality of pixels disposed in a display area of the thin film transistor substrate, the plurality of pixels being connected to a plurality of gate lines and a plurality of data lines;
a plurality of gate pad parts connected to first ends of the plurality of gate lines;
a plurality of first test transistors, each of the plurality of first test transistors being connected to a second end of a corresponding gate line of the plurality of gate lines;
a plurality of data pad parts connected to first ends of the plurality of data lines; and
a plurality of second test transistors, each of the plurality of second test transistors being connected to a second end of a corresponding data line of the plurality of data lines,
wherein the plurality of gate pad parts, the plurality of data pad parts, the plurality of first test transistors, and the plurality of second test transistors are disposed in a non-display area of the thin film transistor substrate, and
wherein the plurality of first test transistors is configured to be switched to receive a first inspection signal and the plurality of second test transistors is configured to be switched to receive a second inspection signal.

2. The thin film transistor substrate of claim 1, wherein the non-display area comprises:
a first non-display area disposed adjacent to a first side of the display area, the plurality of gate pad parts being disposed in the first non-display area;
a second non-display area disposed adjacent to a second side of the display area, the plurality of first test transistors being disposed in the second non-display area;
a third non-display area disposed adjacent to a third side of the display area, the plurality of data pad parts being disposed in the third non-display area; and
a fourth non-display area disposed adjacent to a fourth side of the display area, the plurality of second test transistors being disposed in the fourth non-display area.

3. The thin film transistor substrate of claim 2, further comprising:
a first switching pad to receive a first switching signal and apply the first switching signal to the plurality of first test transistors to switch the plurality of first test transistors; and
a plurality of first test pads to receive the first inspection signal and apply the first inspection signal to the plurality of first test transistors,
wherein the first switching pad and the plurality of first test pads are disposed in the second non-display area.

4. The thin film transistor substrate of claim 3, wherein each of the plurality of first test transistors comprises:
a gate electrode connected to the first switching pad;
a drain electrode connected to a corresponding gate line; and
a source electrode connected to one of the plurality of first test pads,
wherein the source electrodes of a first group of the plurality of first test transistors are commonly connected to a first one of the plurality of first test pads.

5. The thin film transistor substrate of claim 2, further comprising:
a second switching pad to receive a second switching signal and apply the second switching signal to the plurality of second test transistors to switch the plurality of second test transistors; and
a plurality of second test pads to receive the second inspection signal and apply the second inspection signal to the plurality of second test transistors,
wherein the second switching pad and the plurality of second test pads are disposed in the fourth non-display area.

6. The thin film transistor substrate of claim 5, wherein each of the plurality of second test transistors comprises:
a gate electrode connected to the second switching pad;
a drain electrode connected to a corresponding data line; and
a source electrode connected to one of the plurality of second test pads,
wherein the source electrodes of a second group of the plurality of second test transistors are commonly connected to a first one of the plurality of second test pads.

7. A method, comprising:
applying, via a test part disposed in a non-display area of a display substrate, an inspection signal to a plurality of signal lines;
determining, in association with a first inspection technique, whether any of the plurality of signal lines comprises a defect in a display area of the display substrate based on a resistance image formed in the display area in association with the applying of the inspection signal; and
determining, in association with a second inspection technique, whether any of the plurality of signal lines comprises a defect in the non-display area.

8. The method of claim 7, wherein the non-display area comprises:
a first non-display area disposed adjacent to a first side of the display area, the first non-display area comprising a plurality of pad parts connected to the plurality of signal lines; and
a second non-display area disposed adjacent to a second side of the display area, the second non-display area comprising the test part.

9. The method of claim 8, wherein the second inspection technique comprises:
disposing, in association with the second non-display area, an inspection apparatus over the plurality of signal lines;
forming an electric field in association with the inspection apparatus and at least some of the plurality of signal lines; and
causing light to be reflected from the inspection apparatus;
detecting the reflected light that passes through the electric field,
wherein a defect is determined based on the transmittance of the detected, reflected light.

10. The method of claim 9, wherein the inspection apparatus comprises:
a transparent electrode layer to form the electric field in association with at least some of the plurality of signal lines;
a reflective layer facing the transparent electrode layer, the reflective layer being spaced apart from the plurality of signal lines; and
a liquid crystal layer disposed between the reflective layer and the transparent electrode layer, the liquid crystal layer being configured to affect the transmittance of the reflected light in accordance with the electric field.

11. The method of claim 7, wherein the plurality of signal lines correspond to a plurality of gate lines or a plurality of data lines.

12. The method of claim 8, wherein the second inspection technique comprises:
making contact between an inspection apparatus and at least one of the plurality of pad parts;
detecting, via the inspection apparatus, whether the inspection signal is output from the at least one pad part,
wherein a defect is determined based on whether the inspection signal is output.

13. The method of claim 12, wherein making contact between the inspection apparatus and the at least one pad part comprises:
contacting a probe of the inspection apparatus with the at least one pad part.

14. The method of claim 8, wherein the test part comprises:
a plurality of test transistors, each test transistor being connected to a corresponding one of the plurality of signal lines;
a switching pad to receive a switching signal and apply the switching signal to the plurality of test transistors to switch the plurality of test transistors; and
a plurality of test pads to receive the inspection signal and apply the inspection signal to the plurality of test transistors.

15. The method of claim 14, wherein each of the plurality of test transistors comprises:
a gate electrode connected to the switching pad;
a drain electrode connected to a corresponding signal line; and
a source electrode connected to one of the plurality of test pads,
wherein the source electrodes of a first group of the plurality of test transistors are commonly connected to a first one of the plurality of test pads.

16. The method of claim 15, wherein the source electrodes of a second group of the plurality of test transistors are commonly connected to a second one of the plurality of test pads.

17. The method of claim 16, further comprising:
applying, via the test part, another inspection signal to another plurality of signal lines,
wherein the resistance image is formed in the display area in association with the applying of the another inspection signal.

18. A display device, comprising:
a thin film transistor substrate, comprising:
a plurality of pixels disposed in a display area of the display device, the plurality of pixels being connected to a plurality of gate lines and a plurality of data lines crossing the gate lines, and
a plurality of test parts disposed in a non-display area of the display device;
a gate driver to apply one or more gate signals to the plurality of pixels; and
a data driver to apply one or more data voltages to the plurality of pixels,
wherein a plurality of gate pad parts are connected to first ends of the plurality of gate lines and the gate driver in the non-display area,
wherein a first one of the plurality of test parts comprises a plurality of first test transistors, each of the plurality of first test transistors being connected to a second end of a corresponding gate line of the plurality of gate lines, wherein a plurality of data pad parts are connected to first ends of the plurality of data lines and the data driver in the non-display area, wherein a second one of the plurality of test parts comprises a plurality of second test transistors, each of the plurality of second test transistors being connected to a second end of a corresponding data line of the plurality of data lines, and wherein the plurality of first test transistors are configured to be switched to receive a first inspection signal and the plurality of second test transistors are configured to be switched to receive a second inspection signal.

19. The display device of claim 18, wherein the non-display area comprises:
a first non-display area disposed adjacent to a first side of the display area, the plurality of gate pad parts being disposed in the first non-display area;
a second non-display area disposed adjacent to a second side of the display area, the plurality of first test transistors being disposed in the second non-display area;
a third non-display area disposed adjacent to a third side of the display area, the plurality of data pad parts being disposed in the third non-display area; and
a fourth non-display area disposed adjacent to a fourth side of the display area, the plurality of second test transistors being disposed in the fourth non-display area.

20. The display device of claim 19, further comprising:
a first switching pad to receive a first switching signal and apply the first switching signal to the plurality of first test transistors to switch the plurality of first test transistors; and
a plurality of first test pads to receive the first inspection signal and apply the first inspection signal to the plurality of first test transistors,
wherein the first switching pad and the plurality of first test pads are disposed in the second non-display area,
wherein each of the plurality of first test transistors comprises:
a gate electrode connected to the first switching pad,
a drain electrode connected to a corresponding gate line, and
a source electrode connected to one of the plurality of first test pads, and
wherein the source electrodes of a first group of the plurality of first test transistors are commonly connected to a first one of the plurality of first test pads.

21. The display device of claim 19, further comprising:
a second switching pad to receive a second switching signal and apply the second switching signal to the plurality of second test transistors to switch the plurality of second test transistors; and
a plurality of second test pads to receive the second inspection signal and apply the second inspection signal to the plurality of second test transistors,
wherein the second switching pad and the plurality of second test pads are disposed in the fourth non-display area,
wherein each of the second test transistors comprises:
a gate electrode connected to the second switching pad,
a drain electrode connected to a corresponding data line, and
a source electrode connected to one of the plurality of second test pads, and
wherein the source electrodes of a first group of the plurality of second test transistors are commonly connected to a first one of the plurality of second test pads.

22. The thin film transistor substrate of claim 4, wherein the source electrodes of a second group of the plurality of first test transistors are commonly connected to a second one of the plurality of first test pads.

23. The thin film transistor substrate of claim 6, wherein the source electrodes of a second group of the plurality of second test transistors are commonly connected to a second one of the plurality of second test pads.

24. The display device of claim 20, wherein the source electrodes of a second group of the plurality of first test transistors are commonly connected to a second one of the plurality of first test pads.

25. The display device of claim 21, wherein the source electrodes of a second group of the plurality of second test transistors are commonly connected to a second one of the plurality of second test pads.

* * * * *